United States Patent [19]
Sukeda

[11] Patent Number: 4,868,786
[45] Date of Patent: Sep. 19, 1989

[54] MAGNETIC BUBBLE MEMORY WITH MAIN AND AUXILIARY PRINTED WIRING FILM

[75] Inventor: Toshiaki Sukeda, Suzaka, Japan

[73] Assignee: Fujitsu Limited, Kawasaki, Japan

[21] Appl. No.: 37,142

[22] Filed: Apr. 10, 1987

[30] Foreign Application Priority Data

Apr. 10, 1986 [JP] Japan .................................. 61-82848
Apr. 10, 1986 [JP] Japan .................................. 61-82849
Apr. 10, 1986 [JP] Japan .................................. 61-82850

[51] Int. Cl.⁴ .......................... G11C 5/06; G11C 19/08
[52] U.S. Cl. ............................................................ 365/2
[58] Field of Search ............................................ 365/2

[56] References Cited

U.S. PATENT DOCUMENTS 4,027,295  5/1977  Maegawa et al. ...................... 365/2
4,101,970  7/1978  Saito et al. ............................... 365/2
4,160,274  7/1979  Stephenson, Jr. ...................... 365/2

FOREIGN PATENT DOCUMENTS 54-162423 12/1979 Japan .
55-20307   6/1980 Japan .
61-271685 12/1986 Japan .

OTHER PUBLICATIONS

Nikkei Electronics 1985.12.2 P203–218, K. Hirota & Y. Akiba.

Primary Examiner—James W. Moffitt
Attorney, Agent, or Firm—Staas & Halsey

[57] ABSTRACT

A magnetic bubble memory device comprising a chip assembly having a plurality of bubble memory chips superposed one above the other on a main printed wiring film. The lowermost chip is electrically connected to wiring patterns formed on the main printed wiring film. Each of the upper chip or chips is mounted on an auxiliary printed wiring film and electrically connected to the wiring patterns of the main printed wiring film through the auxiliary printed wiring film. The chip assembly is assembled with coils for generating a revolutional magnetic field disposed in a magnetic shield case in such a manner that the bubble memory chips are disposed inside of the coils and both ends of the main printed wiring film are disposed outside of the coils for outer connection.

17 Claims, 14 Drawing Sheets (A)

(B)

(A)

(B)

MAGNETIC BUBBLE MEMORY WITH MAIN AND AUXILIARY PRINTED WIRING FILM

BACKGROUND OF THE INVENTION (1) Field of the Invention

A magnetic bubble memory device has advantageous features in that the data memorized therein is nonvolatile and can be easily rewritten; functional reliability is very high, since it is a solid state device with no mechanical moving parts, and storage density thereof is very high. Therefore, use of the magnetic bubble memory device has become wide-spread in various industrial fields such as electronic exchangers, personal computers, NC (numerical control) devices, and OA (office automation) machinery.

A magnetic bubble memory device having a memory capacity of up to 4 Mbits is already commercially available, and a device having 16 Mbits memory capacity is now under development. Desirably, these magnetic bubble memory devices having a small size and high memory density will be mass-produced at a low cost to compete with other memory devices such as semiconductors and floppy discs.

(2) Description of the Related Art

Attempts have been made to obtain a bubble memory device having high memory capacity by improving the construction of the bubble memory chip itself, by greatly reducing the bubble diameter or providing a dense, miniaturized arrangement of the permalloy patterns or ion injection patterns constituting the bubble tracks. As a result, the above mentioned 4 Mbits capacity device was developed and marketed.

Also, a magnetic bubble memory device comprising a plurality of bubble memory chips disposed on a same substrate has been proposed to increase the memory capacity of the device.

However, the required high memory capacity memory chip having a desired small size has not yet been achieved, since the desired miniaturized pattern can not be formed by the conventional techniques. Therefore, the conventional bubble memory chip has a large size, which inevitably enlarges the size of the bubble memory device since the conventional bubble memory device comprises one or more bubble memory chips disposed on a same plane.

Therefore, when such a device is mounted on a printed circuit board, the device occupies a large area of the printed circuit board, and when the device is assembled within a bubble memory cassette, the cassette must be enlarged.

The conventional bubble memory device comprises: an E-shaped chip mounting plate; X and Y solenoid coils wound perpendicularly to each other on the chip mounting plate; an insulation housing in which the chip mounting plate is housed with a magnetic shunt plate and a bias magnetic plate; a plurality of outer leads disposed in a dual-in-line package (DIP) form on the housing; and a magnetic shielding case covering the housing.

In the conventional method for producing the magnetic bubble memory device, constituent parts, such as the bubble memory chip, X and Y solenoid coils, Z coil, the magnetic shunt plate, the bias magnetic plate, the shield case, and the insulation housing with outer leads, are supplied to an assembly line in series, in a predetermined sequence. However, the conventional method requires a number of complicated fabrication steps, and much time. Thus, low fabrication reliability and high cost of the products is inevitable.

SUMMARY OF THE INVENTION

The present invention alleviates the above mentioned drawbacks of the conventional art from the aspect of the chip mounting technique.

In accordance with the present invention there is provided, a magnetic bubble memory device comprising a chip assembly including a plurality of bubble memory chips superposed one above the other on a main printed wiring film, the lowermost chip being electrically connected to wiring patterns formed on the main printed wiring film and each of the upper chip or chips being mounted on an auxiliary printed wiring film and electrically connected to the wiring patterns of the main printed wiring film through the auxiliary printed wiring film, wherein the chip assembly is assembled with coils for generating a revolutional magnetic field disposed in a magnetic shielding case in such a manner that the bubble memory chips are disposed inside of the coils and both ends of the main printed wiring film are disposed outside of the coils for outer connection.

With this arrangement of the present invention, a plurality of the bubble memory chips are superposed one above the other in a coil assembly unit for generating a revolutional magnetic field, thus reducing occupied area of the bubble memory device with respect to the memory density.

Also, the superposed plurality of chips are connected to an outer bubble control circuit through patterns of one common main printed wiring film, which simplifies the outer connection structure.

In accordance with an embodiment of the present invention there is provided, a drive coil of the magnetic bubble memory device comprising an insulation molded body in which at least X and Y coils for generating a plane revolutional magnetic field are insert-molded, the molded body having a through hole for insertion of bubble memory chips therein, and being provided with a recess on an outer surface thereof for receiving at least a bias magnetic plate.

With this arrangement of the embodiment of the present invention, drive coils are insert-molded within a molded body of resin having a through hole and a recess for receiving a bias magnetic plate. Therefore, it is possible to separately form first a bubble memory chip assembly and a drive coil assembly and then combine these assemblies to fabricate a magnetic bubble memory device, thus reducing the manufacturing time since the chip assembly and the coil assembly can be formed individually at the same time. The production process is also simplified, which results in an increased reliability of the fabrication of the device.

Further, to solve the problems of the prior art, the present invention provides a method for producing a magnetic bubble memory device using a flexible continuous insulation film having a plurality of the same kind of wiring patterns formed thereon in series, the method comprising: (i) making a first chip mounted continuous film by mounting a plurality of bubble memory chips on the film during the feed motion thereof, the terminals of each chip being connected to the patterns of the film; (ii) making a plurality of second chip mounted films by cutting a continuous chip mounted film fabricated in the same way as in step (i) at every wiring pattern unit; (iii) placing the second chip mounted film on the first chip mounted film so that chips of the first and second films are superposed one above the other, and connecting together patterns of the first and second films; (iv) making a plurality of chip assemblies by cutting the first film combined with the second film placed thereon at every pattern unit; and (v) assembling the chip assembly with at least plane revolutional magnetic field generation coils, a bias magnetic plate, and a shielding case.

According to the method of the present invention, a plurality of bubble memory chips are superposed and assembled within a revolutional magnetic field generation coils assembly, thus making the outer shape small and reducing the occupied area when in use with respect to the memory density.

Also, the chip assemblies are produced during the continuous feed of the printed wiring film, thus enabling mass-production of the devices by utilizing an automatic assembling means as used in semiconductor device production.

Also, it is possible to fabricate the bubble memory chip assemblies and the drive coil assemblies separately in parallel lines simultaneously, thus reducing the production time and increasing the efficiency of the process. Moreover, the fabrication reliability of the device is increased since the assembling processes are simplified.

DETAILED DESCRIPTION OF THE PREFERRED EMBODIMENTS

Figure 1:
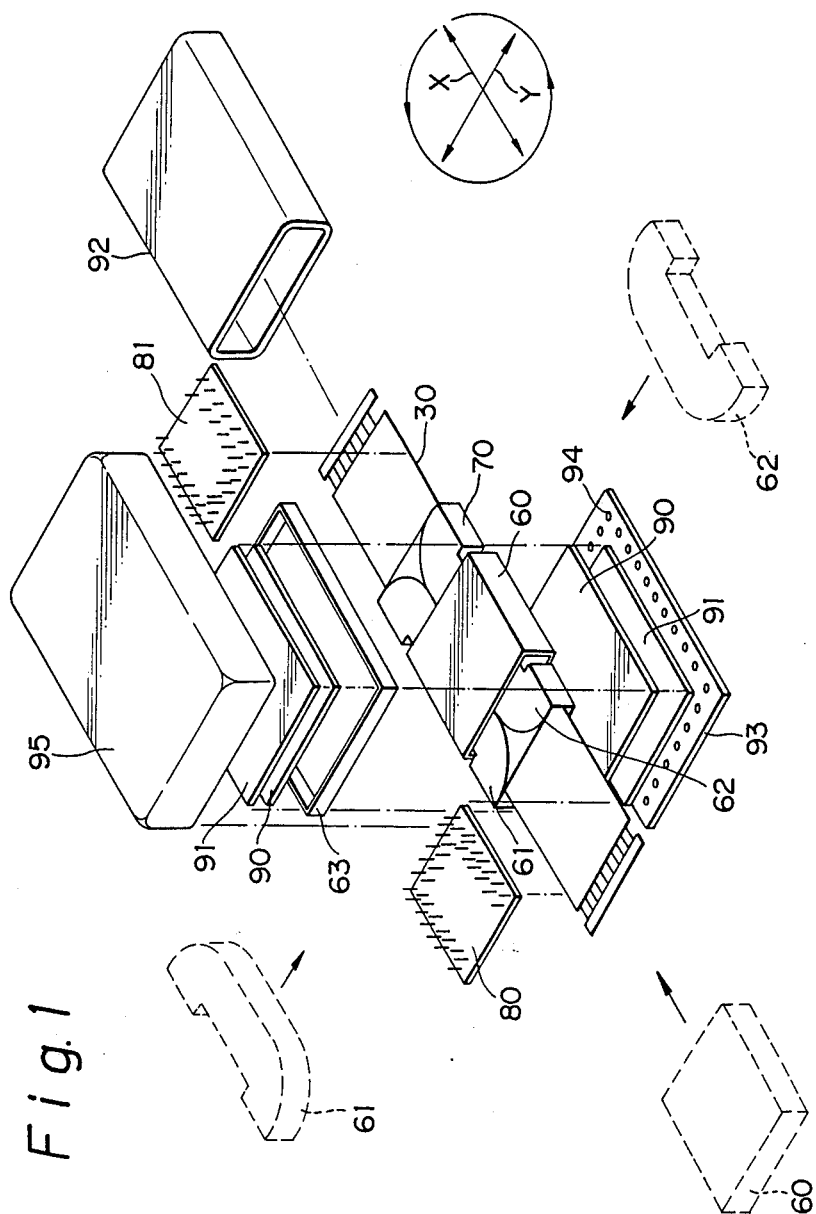
FIG. 1 is an exploded view showing the essential construction of the bubble memory device of the present invention.
Figure 2:
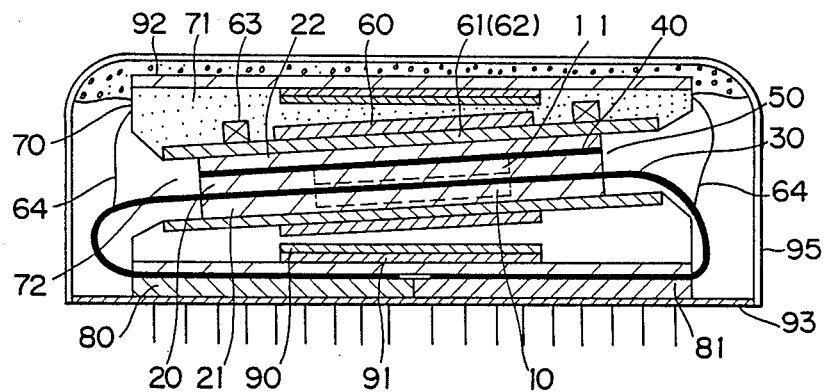
FIG. 2 is a vertical sectional view of the bubble memory device of the present invention.

Embodiments of the present invention are described hereinafter with reference to the drawings.

(1) Explanation of Device Structure and Process for Fabricating the Device

The structure of the magnetic bubble memory device of the present invention is explained with reference to FIGS. 1, 2, 3, 7, and 15.

The bubble memory device illusrated in the drawings comprises bubble memory chips 10, 11, a spacer 20, supports 21, 22, a main printed wiring film 30, an auxiliary printed wiring film 40, X and Y coils 60, 61, 62 for generating a revolutional magnetic field, a Z coil 63, terminal plates 80, 81, magnetic shunt plates 90 for uniformizing the bias magnetic field, bias magnetic plates 91 for generating a magnetic field perpendicular to the chip surface, a magnetic shielding case 92, an insulation plate 93 having terminal pin guide holes 94, and a cover 95 of magnetic or non-magnetic material. Numeral 50 designates a chip assembly and numeral 70 designates a drive coil assembly.

Figure 3:
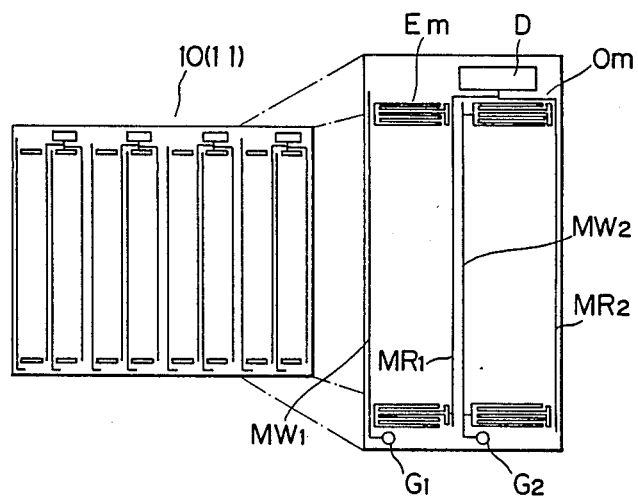
FIG. 3 is a plan view of an example of the bubble memory chip circuit assembled in the device of the present invention.

Each of the memory chips 10, 11 comprises a plurality of memory blocks, as illustrated in FIG. 3. Four blocks are provided in this particular example. As shown in the enlarged illustration in FIG. 3, each block comprises bubble generators $G_1$, $G_2$, a bubble detector D, writing major lines $MW_1$, $MW_2$, reading major lines $MR_1$, $MR_2$, an even minor loop $E_m$, and an odd minor loop $O_m$; thus constituting an even/odd type memory block.

In this embodiment, the device comprises two memory chips 10, 11, thus doubling the memory capacity while maintaining a small shape. A memory device having a 16 Mbits or 32 Mbits memory capacity is obtained by using two 8 Mbits or 16 Mbits memory capacity chips.

The memory chip 10 is electrically connected to patterns of the main printed wiring film 30, as described later. The memory chip 11 is similarly connected to the auxiliary printed wiring film 40. The auxiliary printed wiring film 40 is placed on and combined with the main printed wiring film 30 in such a manner that the two memory chips 10, 11 are superposed at the same position in parallel relationship to each other, thus constituting the chip assembly 50.

The printed wiring films 30, 40 have patterns formed thereon by, for example, etching a metallic film coated an an insulation film.

Figure 15:
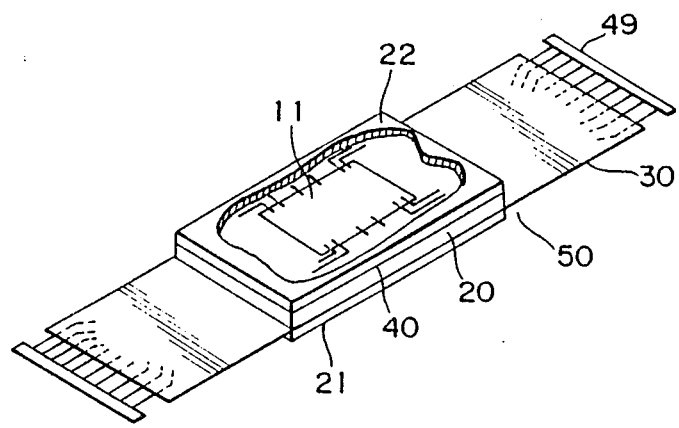
FIG. 15 is a perspective view of the chip assembly according to the present invention.

The chip assembly 50 is illustrated in FIG. 15. A spacer 20 is interposed between the two memory chips 10, 11 to form a predetermined gap therebetween. The main film 30 is disposed between the spacer 20 and a lower support 21. The auxiliary film 40 is disposed between the spacer 20 and an upper support 22. By this arrangemment, the memory chips 10, 11 are held in parallel relationship to each other.

Also, the spacer 20, the printed wiring films 30, 40, and the supports 21, 22 are bonded to each other. The patterns of the auxiliary film 40 are electrically connected to the patterns of the main film 30, as described later. Both ends of the main film 30 extend outward from the chip assembly for the connection of the chips 10, 11 to an outer bubble control circuit.

The drive coil assembly 70 comprises: a pair of X coils 61, 62, each comprising a multi-layer plane coil folded to form a U-section shape; a Y coil 60 comprising a rectangular-frame shaped solenoid coil; and a Z coil 63 for adjusting the bias magnetic field and erasing the memorized data at one time. These coils 60 to 63 are insert-molded within an insulation molded body 71, i.e., inserted and molded within the molding material during the molding process.

The X and Y coils generate a revolutional magnetic field parallel to the surfaces of the chips 11, 12 by composing an X-direction magnetic field and Y-direction magnetic field, as described in detail in Japanese Examined Patent Publication (Kokoku) No. 55-20307. The ring-shaped Z coil 63 generates a magnetic field perpendicular to the revolutional magnetic field.

The molded body 71 of the drive coil assembly 70 has an inclined through hole 72 for receiving the chip assembly 50, and has a recess 73 for receiving the magnetic shunt 90 and the magnetic plate 91 on each of the upper and lower surfaces thereof. Wire ends 64 of coils 60 to 63 extend from both sides of the molded body 71.

In FIG. 1, the drive coil assembly 70 is illustrated without the molded body to show the coil arrangement. The assembled state is represented by solid line and the disassembled state is represented by dashed lines.

The shielding case 92 is installed on the molded body 71, which is combined with the magnetic shunt 90 and the magnetic plate 91 disposed within the recess thereof, thus forming the drive coil assembly 70. Then, the chip assembly 50 is inserted in the through hole 72 of the drive coil assembly 70, and the terminal plates 80, 81 are attached to both ends of the main printed wiring film 30, which ends extend from the drive coil assembly 70.

The chip assembly 50 is inserted in the through hole 72 of the drive coil assembly 70 and secured thereto, at the position where the chips 10, 11 are disposed at the center of coils 60 to 63 and the magnetic plate 91, by an adhesive resin (not shown). In this state, the chip surfaces are inclined with respect to the magnetic plates 91 due to the inclination of the through hole 72. In this state, a hold magnetic field is applied to the bubble chips 10, 11.

Each of the terminal plates 80, 81 is formed as a pin grid array comprising a ceramic plate 82 and a number of pins 83 projecting perpendicularly from the lower surface of the ceramic plate 82. Conductive patterns (not shown) are formed on an inner layer of the ceramic plate 82. A number of terminal pads 84 are formed in a row on the upper surface of the ceramic plate 82 and connected to the terminal pins 83 through throughholes and the conductive patterns.

Each of the terminal pads 84 of the plates 80, 81 is connected to each of the terminal patterns 31 formed at both ends of the main printed wiring film 30 by a heat press bonding process.

A plurality of connection pads 32 are formed on the main printed wiring film 30 projecting from both sides of the coil assembly. Each of the wire ends 64 of the coils is connected to one of the connection pads 32 by soldering.

Figure 7:
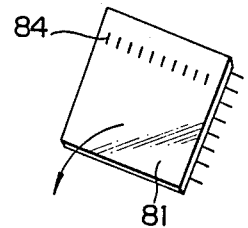
FIG. 7 is a perspective view showing the combined state of the chip assembly and the drive coil assembly according to the present invention.
Figure 7:
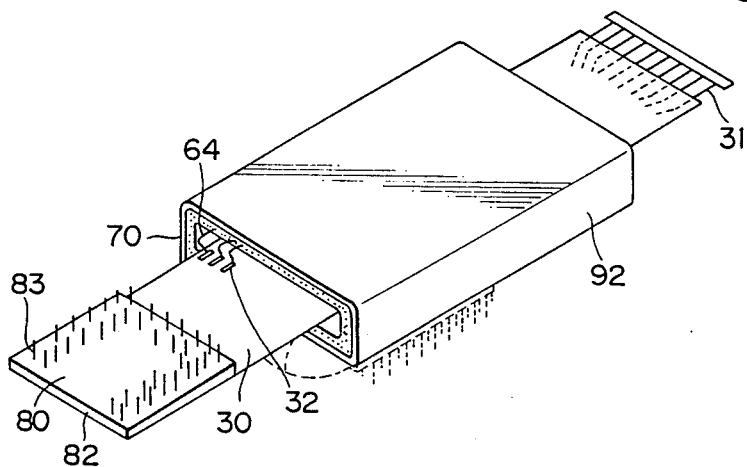

Then, both sides of the main printed wiring film 30 projecting out of the coil assembly are folded under the coil assembly, as illustrated in FIG. 7 by dotted lines, and bonded to the rear surface of the shielding case 92. Thus, the terminal plates 80, 81 are secured to the shielding case 92 and the pins 83 project perpendicularly from the rear side of the shielding case 92, to constitute a device unit structure.

Then, the device unit structure is disposed in the cover 95 reversed to open upwardly in such a manner that the terminal plates 80, 81 are positioned upside down. Adhesive resin 96 is then injected within the cover 95 to form a combined single unit.

The opening of the cover 95 is then covered by an insulation plate 93 having a plurality of through holes through which the pins 83 of the terminal plates 80, 81 penetrate the insulation plate 93 and project outward, thus forming a bubble memory device of the present invention.

The adhesive resin 96 may be supplied to fill the entire inner space of the cover 95 so that the device unit structure is buried within the resin 96.

In a modification of the above mentioned embodiment, the structure illustrated in FIG. 7 prior to providing the terminal plates 80, 81 may be directly mounted on a printed circuit board (not shown) in such a manner that the terminal patterns 31 of the main printed wiring film 30 are connected to printed patterns of the printed circuit board, and the shielding case 92 is secured to the printed circuit board by securing belt means.

(2) Explanation of the Process for Fabricating the Drive Coil Assembly

The process for fabricating the drive coil assembly 70 is described with reference to FIGS. 4 to 6.

Figure 4:
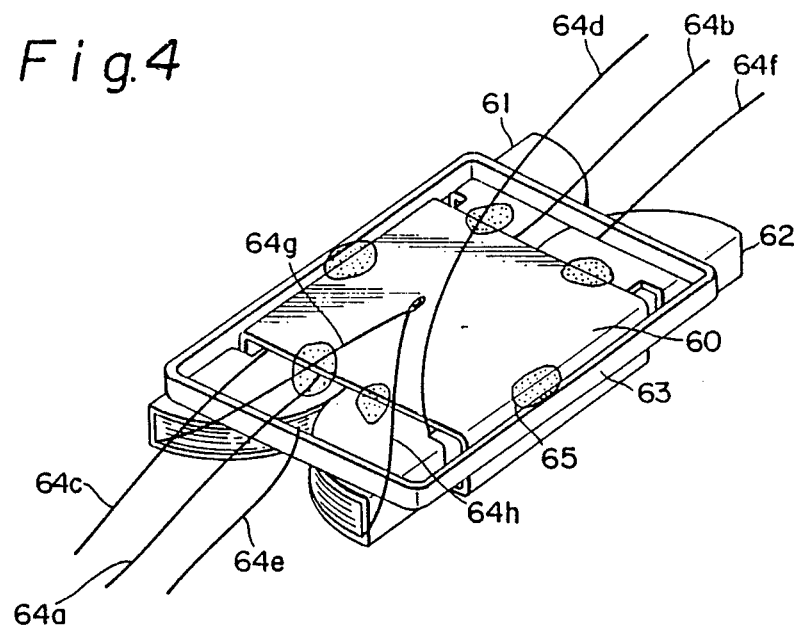
FIG. 4 is a perspective view showing a temporarily assembled state of the drive coils of the magnetic bubble device of the present invention.

FIG. 4 illustrates a temporary combined state of the coils 60 and 63.

First, the folded plane X coils 61, 62 are disposed on a not shown instrument, facing each other. The Y coil 60 is then installed around the X coils, and the Z coil 63 is disposed on the Y coil 60. The input and output wire ends 64a and 64b of the Y coil 60 are pulled outwardly from the coil assembly, and disposed on each side thereof, respectively. The leading wire ends 64c, 64d of the X coils 61, 62 are also pulled outwardly from the coil assembly and disposed on each side thereof, respectively. The tailing wire ends 64g, 64h of the X coils 61, 62 are then connected together. The wire ends 64e, 64f of the Z coil 63 are pulled outward from the coil assembly and disposed on each side thereof, respectively. Then, the coil assembly of coils 60 to 63 is temporarily combined with an adhesive agent 65.

Figure 5:
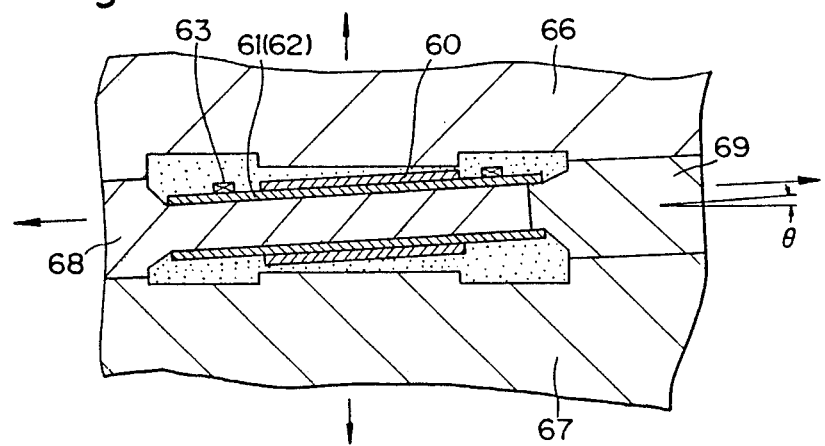
FIG. 5 is a vertical sectional view for explaining the insert-molding process of the drive coils of FIG. 4.
Figure 6:
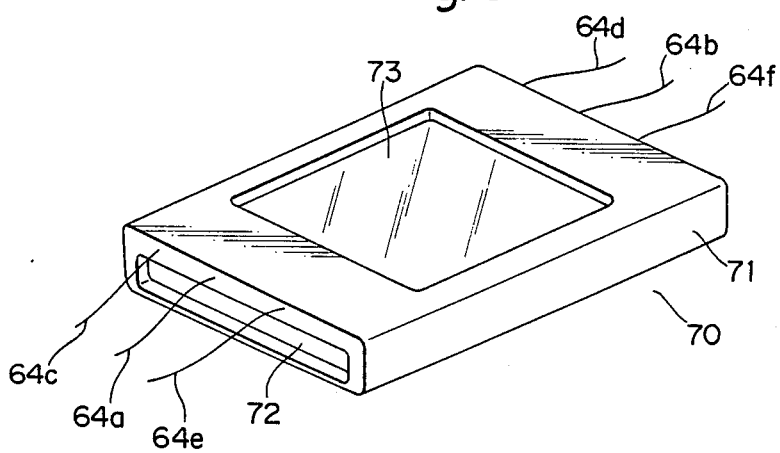
FIG. 6 is a perspective view of the drive coil assembly of the present invention.

The coil assembly is then taken out of the instrument and set in a molding means, as illustrated in FIG. 5. The molding means comprises an upper mold 66, a lower mold 67, a left core 68, and a right core 69. The molds and cores 66 to 69 open upward, downward, leftward, and rightward, respectively. The cores 68, 69 incline by an angle $\theta$. The wire ends 64a to 64f of X, Y and Z coils are held within guide groove (not shown) formed on mating surfaces between the molds 66, 67 and the cores 68, 69. After setting the coils within the molds, an insulation resin is injected into the cavity of the molds, so that the drive coil assembly 70 of FIG. 6 is produced.

A magnetic shunt 90 and a magnetic plate 91 are disposed in a recess 73 of the drive coil assembly 70, and then a shielding case 92 is installed on the drive coil assembly 70. The magnetic plate 91 is magnetized by an outer magnetic field applying means to a predetermined bias magnetic strength.

The magnetic bubble memory device of the present invention is fabricated by combining the chip assembly 50 and the drive coil assembly 70.

(3) Explanation of the Process for Producing the Chip Assembly 50

A process for producing the chip assembly 50 is described with reference to FIGS. 8 to 15.

Figure 8:
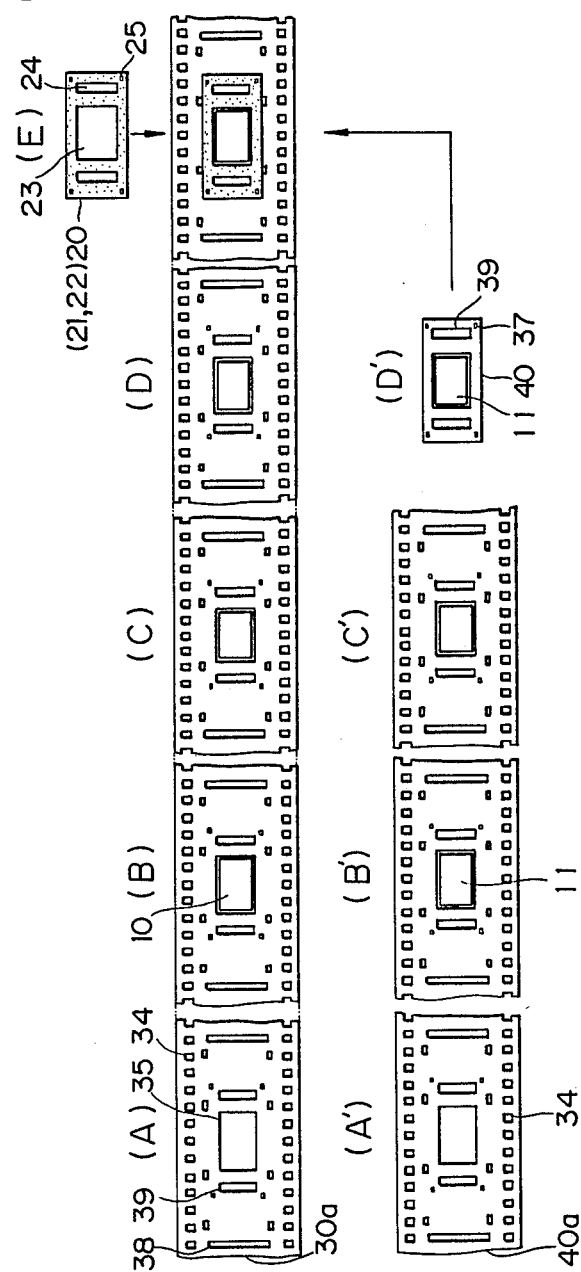
FIG. 8 is a view for explaining the process of producing the chip assembly according to the present invention.

In FIG. 8, reference 30a designates a continuous strip like printed wiring film to form the above mentioned main printed wiring films 30, and reference 40a designates a continuous strip like printed wiring film to form the above mentioned auxiliary printed wiring film 40. These films 30a and 40a have a plurality of pattern units, formed thereon, as illustrated in FIG. 9, in series along the longitudinal direction of the film.

The two films 30a and 40a have exactly the same shape and pattern arrangement, and two kinds of wiring films 30 and 40 are formed from these continuous films 30a and 40a, respectively.

Figures 9A, 9B:
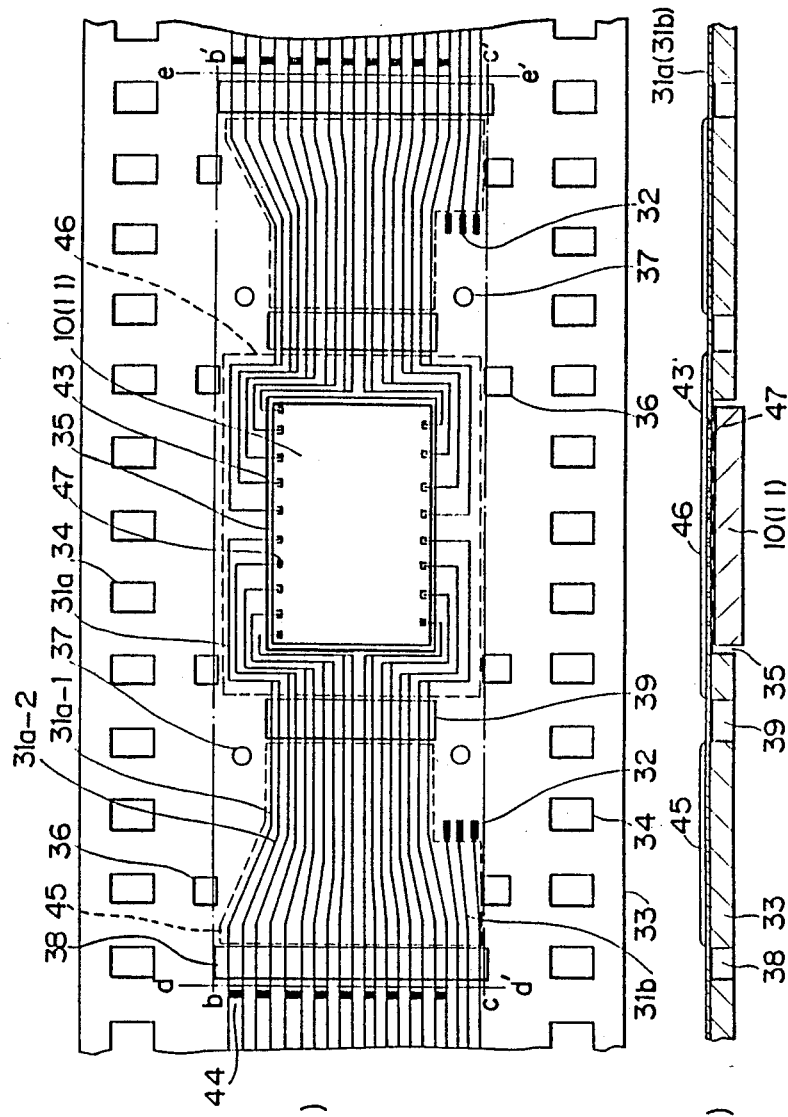
FIG. 9(A) is a plan view of the printed wiring film used in the process of FIG. 8.
FIG. 9(B) is a side view of the film of FIG. 9(A)
Figure 10:
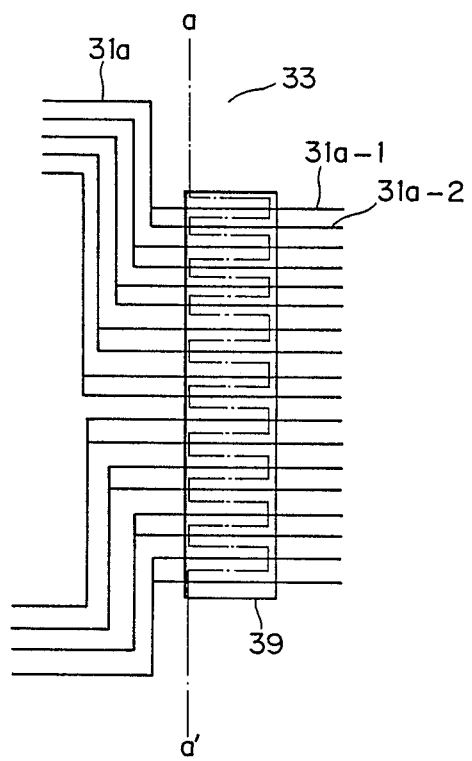
FIGS. 10(A) and 10(B) are views for explaining the pattern cutting process of the first film of FIG. 8.
Figure 10:
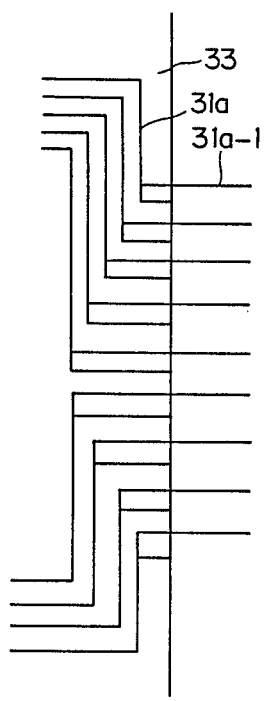
Figure 11:
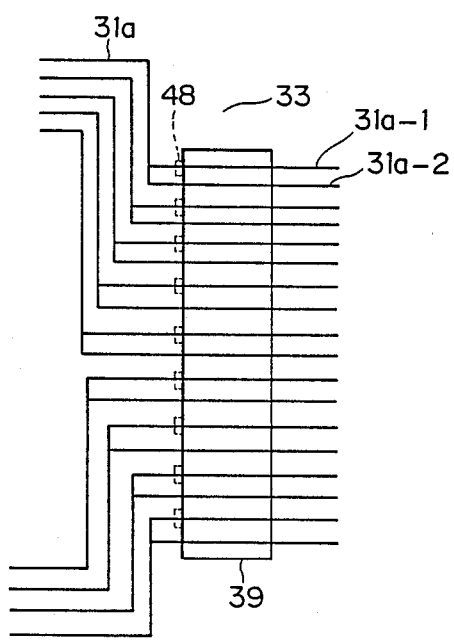
FIGS. 11(A) and 11(B) are views for explaining the pattern cutting process of the second film of FIG. 8.
Figure 11:
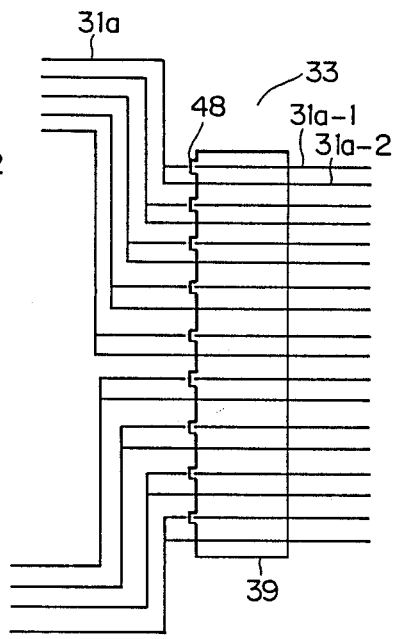

An enlarged pattern unit of the film 30a or 40a is illustrated in FIGS. 9(A) and 9(B). A plurality of patterns 31a are formed on the film for connection with the chip 10 or 11. In this particular embodiment, nine patterns 31a are led to each longitudinal side of the chip. Each pattern 31a is split into two parallel patterns 31a-1 and 31a-2. Reference 31b designates a coil connection pattern, and three coil connection patterns 31b are disposed on either side of the chip. Reference 32 designates a connection pad. These patterns are formed on a flexible insulation film 33 having feed holes 34 formed at predetermined intervals, an opening 35 for receiving the chip 10 or 11, positioning holes 36 for cutting the film, and positioning holes 37 for superposing the films. The insulation film 33 has a slit 38 at each end of the pattern unit, and patterns 31a-1, 31a-2 and 31b bridge the slit 38. The insulation film 33 also has another slit 39 at each side of the chip. The patterns 31a bridge the slit 39. The slit 39 is provided for selective connection of patterns of the main and auxiliary printed wiring films 30 and 40, as described later.

The pattern unit is formed symmetrically in the longitudinal direction with respect to the center line of the opening 35 for the chip. Adjacent pattern units are continuous through the patterns 31a-1, 31a-2 and 31b.

The patterns are formed on the films 30a, 40a as follows. First, a strip-like copper film 41 (see FIG. 14) about 35 μm thick is bonded over the insulation film 33 which has holes 34, 36, 37 and openings 35 performed therein. Then, the copper film 41 is subjected to a patterning treatment, i.e., coating resist agent, exposing through pattern mask, developing, and etching the copper, so that the patterns 31a, 31b are formed on the insulation film 33. A gold layer 42 (FIG. 14) 2-5 μm thick is plated in the copper pattern, to ensure reliable connection between patterns, through the heat press bonding process. The gold layer plating process is conducted after the copper etching process.

The thus-formed patterns 31a, 31a-1, 31a-2 bridge the slits 38, 39, and each end of the pattern 31a projects inside the opening 35 at a predetermined position to constitute a terminal for connection with the chip 10 or 11. The diverged patterns 31a-1 and 31a-2 are interconnected through a bridge pattern 44. Also, the patterns 31b bridge the slit 38 and are connected to the pad patterns 32.

Insulation layers 45 and 46 are coated on the film 33 by a screen printing process, as illustrated in FIG. 9(A) in dashed lines. The insulation layer 45 covers the patterns 31a-1, 31a-2, 31b, while uncovering the pads 32. The other insulation layer 46 covers patterns 31a, 31b formed around the opening 35. These insulation layers 45, 46 increase the reliability of the insulation between the patterns.

The above-mentioned films 30a and 40a are fed continuously by feed means (not shown) engaging the feed holes 34 of the films through a bonding machine (not shown) and a cutting machine (not shown) wherein the films are processed to fabricate the chip assemblies 50.

In FIG. 8, the wiring patterns are omitted from the illustration. First, the film 30a of illustration (A) is fed by predetermined pitches and a chip 10 is mounted on the film 30a as shown in illustration (B). The chip mounting process is conducted by a bonding machine wherein the chip 10 is positioned at the opening 35, and the terminal patterns 43 are then connected to the pads 47 of the chip 10 by the heat press bonding method. FIG. 9 represents this state of the film having the chip mounted thereon. Then, the film is further fed to the position (C) where the chip is tested by placing a probe on the patterns 31a which are exposed through the slit 38. In this testing process, the resistance of the generators G1, G2, the detector D, swap gates, and replicator gates are measured. Also, an outer revolutional magnetic field and bias magnetic field are applied to the chip 10 to check the function of the chip 10.

Similarly, as for the auxiliary film 40a, the film of (A') is fed to (B') where the chip 11 is mounted by the heat press bonding method and then the chip test is conducted at the position (C').

Then, at positions (D) and (D'), a pattern cutting process is conducted for the non-defective pattern unit of each film.

The pattern cutting process is explained with reference to FIGS. 10(A) and 10(B), and FIGS. 11(A) and 11(B), which illustrate the pattern arrangement around the slit 39 on an enlarged scale. FIGS. 10(A) and 10(B) represent the auxiliary film 40a, and FIGS. 11(A) and 11(B) represent the main film 30a.

In the auxiliary film 40a, the insulation film 33 and the diverged patterns 31a-1, 31a-2 bridging the slit 39 are cut along the zigzag dash-dot line a-a', as illustrated in FIG. 10(A), and the insulation film 33 is also cut along the upper cutting line b-b' and the lower cutting line c-c'.

Accordingly, only the diverged patterns 31a-1 project from each edge of the insulation film 33, as illustrated in FIG. 10(B). This state of the film constitutes the auxiliary printed wiring film 40 which is illustrated at (D') in FIG. 8.

On the other hand, in the main film 30a, the diverged patterns 31a-1 and the insulation film 33 are simultaneously die-cut at positions 48 in FIG. 11(A). Accordingly, the diverged patterns 31a-1 are separated from the pattern 31a in the slit 39, as illustrated in FIG. 11(B).

When the film 30a is fed to the position (E), the chip mounted auxiliary printed wiring film 40a is placed in the main printed wiring film 30a with the spacer 20 and supports 21, 22. Then, the patterns of the film 30a and the patterns of the film 40 are interconnected.

The spacer 20 and the supports 21, 22 have the same shape, i.e., a rectangular opening 23 corresponding to the opening 35 for receiving the chip, slits 24 on either side of the opening 23 corresponding to the slits 39, and positioning holes 25 at the four corners thereof corresponding to the positioning holes 37.

Figure 14:
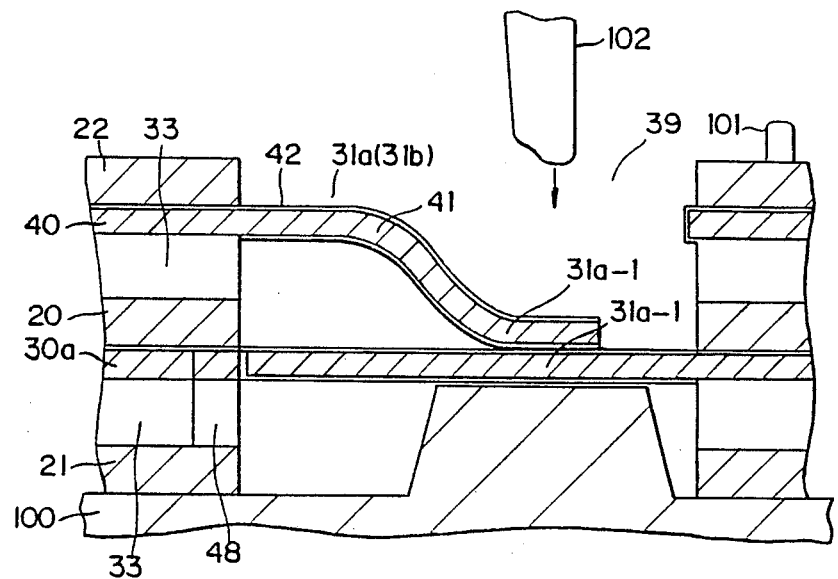
FIG. 14 is a vertical sectional view of the connected patterns shown in FIGS. 12 and 13.

The state of the films 30a and 40 at position (E) is illustrated in FIG. 14. The support 21, the film 30a, the spacer 20, the auxiliary film 40, and the support 22 are stacked, in this order, on a bed 100 of the bonding machine using the four positioning pins 101 (only one pin is illustrated) standing on the bed 100 as a guide means and penetrating through the positioning holes 25 and 37 of the stacked members. The spacer 20, supports 21, 22, and the films 30a, 40 are bonded together by an adhesive agent precoated on the surfaces of these members.

In this stacked state, a bonding head 102 descends into the slit 39 to heat and press the patterns 31a-1 of the upper auxiliary film 40 against the patterns 31a-1 of the lower film 30a to form an electrical connection therebetween.

In this bonding process, it is preferable to provide a bump at the bonding position to ensure the reliability of the bonding process.

As the result of this bonding process, the upper chip 11 mounted on the auxiliary film 40 is connected to the lower diverged patterns 31a-1 of the lower film 30a through the upper diverged patterns 31a-1 of the upper film 40, and disconnected from the lower chip 10 mounted on the lower film 30a, since the diverged patterns 31a-1 of the lower film 30a are separated from the chip 10. On the other hand, the chip 10 is connected only to the diverged patterns 31a-2 of the lower film 30a which are separated from each of the diverged patterns 31a-1 and 31a-2 of the upper film 40.

Figure 12:
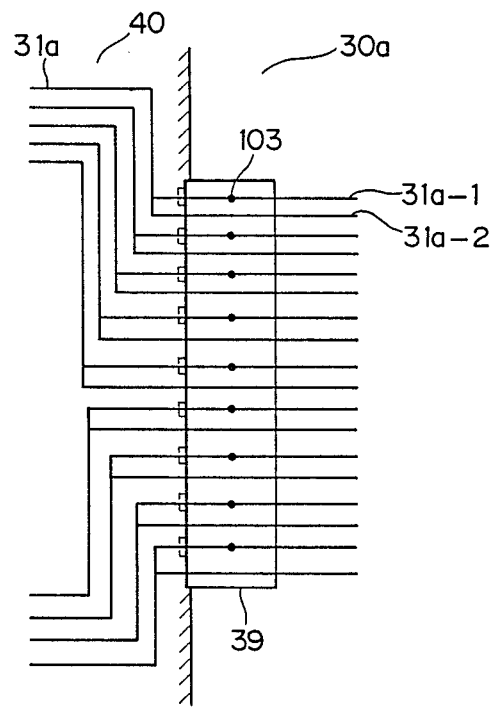
FIG. 12 is a plan view of patterns of the first and second films of FIGS. 10 and 11 connected together.
Figure 13:
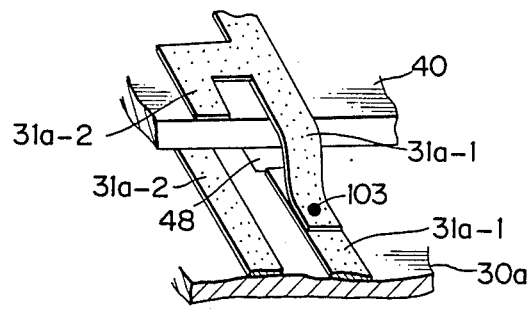
FIG. 13 is a partial perspective view of the pattern of FIG. 12.

The above-mentioned connections are illustrated in the plan view of FIG. 12 and the perspective view of FIG. 13, wherein numeral 103 designates the bonding point.

The film 30a having the chip mounted auxiliary film 40 mounted thereon is further fed and cut along the cutting lines b-b', c-c', d-d' and e-e' by a cutting machine, whereby a chip mounted main printed wiring film 30 is cut from the film 30a, thus forming a chip assembly 50 having two chips 10, 11 therein, as illustrated in FIG. 15.

In FIG. 15, numeral 49 designates a remaining edge portion of the film 30a after cutting along the lines d-d' and e-e'. The edge portion 49 holds the ends of the diverged patterns 31a-1, 31a-2 and prevents the deformation thereof, which guarantees a reliable connection with the terminal pads 84 of the terminal plates 80, 81.

The chip assembly 50 fabricated in the above mentioned way is assembled with the drive coil assembly 70 and the shielding case 92 to form a magnetic bubbles memory device of the present invention.

A number of the auxiliary printed wiring films 40 may be prefabricated instead of being fabricated simultaneously with the main wiring film 30 as in the above embodiment.

Also, in the above embodiment, step of stacking the members (such as the film 40, etc.) and the step of bonding the patterns are conducted at the same place, i.e., on the bed of the bonding machine. However, these steps may be conducted at different places.

The number of chips is not limited to two, in that the number of patterns diverged from one pattern can be made to correspond to the number of chips. Therefore, if three chips are stacked on the film, each pattern connected to each pad of the chips is split into three patterns instead of two patterns as in the above embodiment. Note, if the number of chips can be increased, the memory capacity of the device can be enlarged.

In accordance with the above mentioned present invention, it is possible to provide a magnetic bubble memory device having a large memory capacitor which requires only a small mounting area for installation thereof, with a slight increase in the height thereof which is within the tolerable range, which is very advantageous in actual application.

Also, in accordance with the embodiment of the present invention, it is possible to fabricate the drive coil assembly as an individual unit simultaneously with but independently from the chip assembly, and to combine the two assemblies later, thus reducing the time needed for producing the device and simplifying the producing process, which enables mass-production of the devices at a low cost and is very advantageous in actual application.

In accordance with the present invention, it is possible to effectively mass-produce the magnetic bubble memory devices having a high memory capacity and a high reliability, at a low cost, which is very advantageous in actual application.

Figure 16:
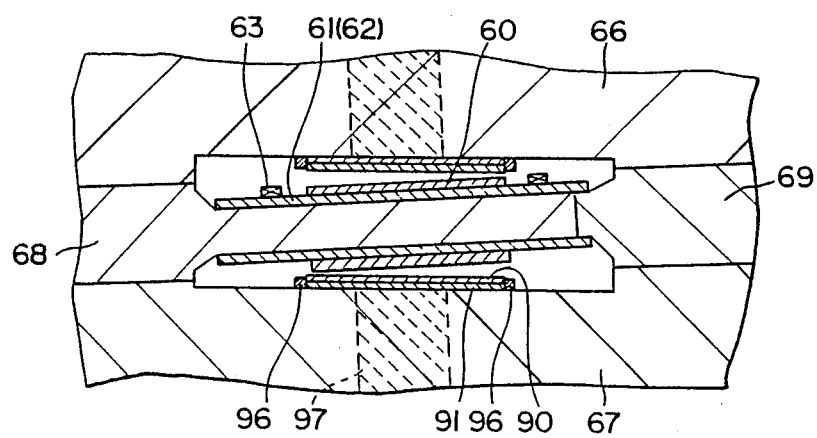
FIG. 16 is a vertical sectional view for explaining another example of the insert-molding process of the drive coils of FIG. 4.

FIG. 16 illustrates another example of molding method for producing the drive coil assembly of the present invention. The upper and lower molds 66 and 67 are provided with projections 96 for positioning the magnetic shunt 90 and the bias magnetic plate 91. A magnet 97 is buried in each of the upper and lower molds 66, 67 at a position facing the aagnetic plate 91. The X coils 61, 62, Y coil 60, and Z coil 63 are set between the molds 66, 67 in the same manner as in the example of FIG. 5. In the example of FIG. 16, the magnetic shunt 90 and magnetic plate 91 are set and held within each mold by the magnetic force of the magnet 97 in addition to the coils 60 to 63. A resin is injected into the cavity between the molds to simultaneously combine the coils, magnetic shunts, and magnetic plates by the resin and form a drive coil assembly unit. With this molding method, the process for producing the drive coil assembly is further simplified.

Figure 17:
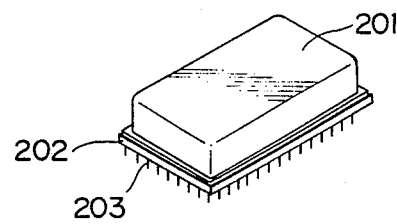
FIG. 17 is a perspective view of another example of the magnetic bubble memory device of the present invention.

FIG. 17 is an outer view of another example of the magnetic bubble memory device of the present invention. In this example, the bubble device unit is installed within a terminal frame member 202 having a number of pins 203 and covered by a case 201, instead of using the terminal plates 80, 81 of the afore embodiment.

Figure 18:
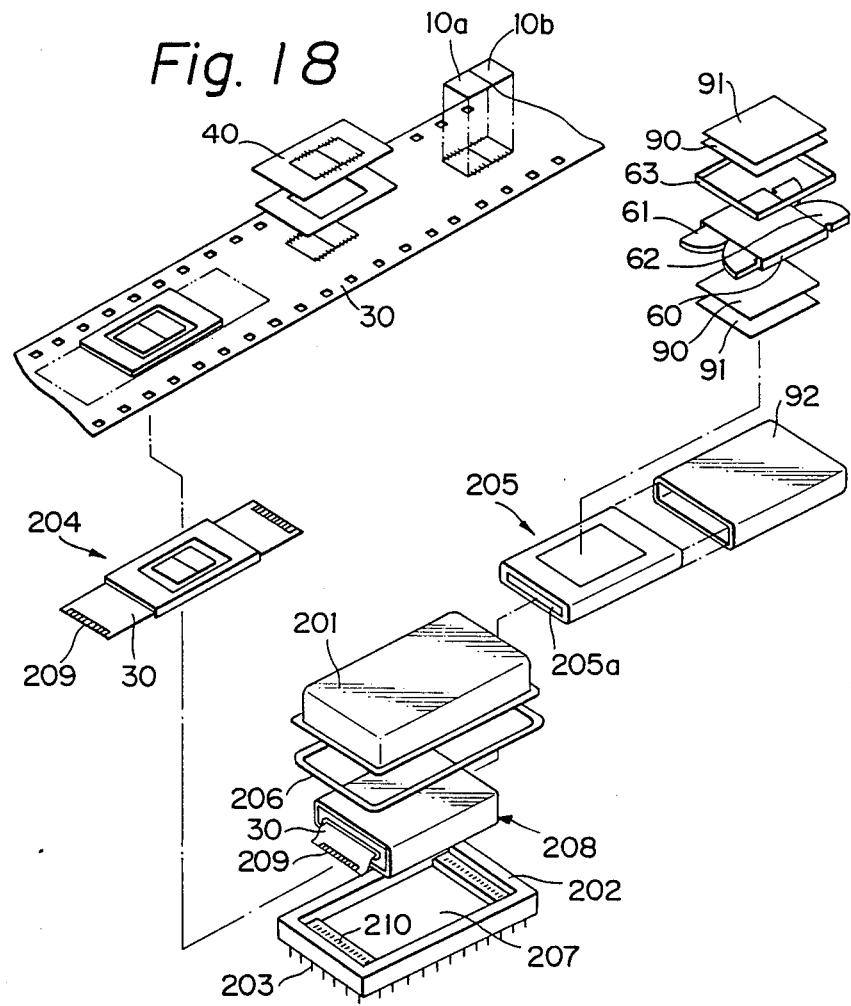
FIG. 18 is a view for explaining the process of producing the device of FIG. 17.

FIG. 18 is an exploded view of the magnetic bubble memory device of FIG. 17, showing the production process thereof. A chip assembly 204 is fabricated in a similar manner as in the case of the aforementioned embodiment. However, in this embodiment of FIG. 18, two chips (10a, 10b) are mounted side by side on each of the main and auxiliary printed wiring films 30, 40. The number of chips mounted on one film is not limited to one (former embodiment) or two (this embodiment). A connection terminal portion 209 is formed on either side edge of the main film 30 of the chip assembly 204, in a similar manner to that of the former embodiment.

Figure 19:
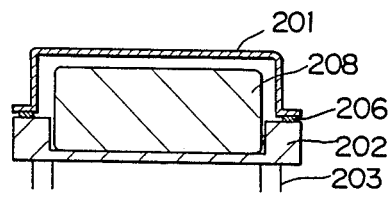
FIG. 19 is a lateral vertical sectional view of the device of FIG. 17.
Figure 20:
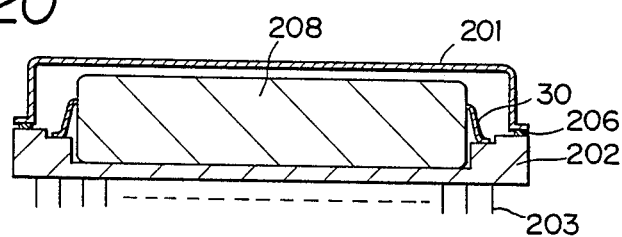
FIG. 20 is a longitudinal vertical sectional view of the device of FIG. 17.

On the other hand, a drive coil assembly 205 is formed by the molding process in the manner shown in FIGS. 5 or 16. The chip assembly 204 is inserted into a through hole 205a of the coil assembly 205 which is covered by a shield 92, thus forming a magnetic bubble memory unit 208. The unit 208 is placed within a recess 207 of the ceramic terminal frame member 202, and the terminal end portions 209 of the film 30 of the chip assembly 204 are connected to terminal patterns 202 formed on either side edge of the terminal frame member 202 by a heat press bonding process. As illustrated in FIGS. 19 and 20, the terminal frame member 202 housing the memory unit 208 therein is sealed by the metal cover 201 through a metal ring 206, by soldering. The cover 201 and ring 206 may be made of Kovar (trade name).

The bubble memory unit 208 composed of the chip assembly 204 and the coil assembly 205 may be directly mounted on a printed circuit board to compose a desired circuit, without providing the terminal frame member 202 and cover 201.

Figure 21:
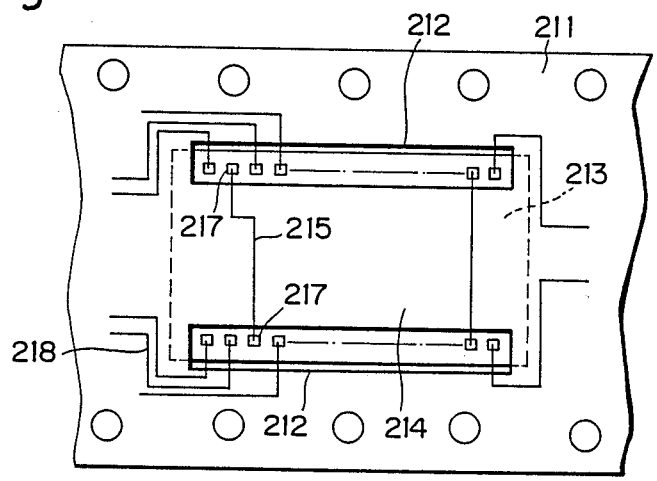
FIG. 21 is a plan view of another example of the printed wiring film of the present invention; and, FIG. 22 is a perspective view of another example of chip mounting structure of the present invention.

FIG. 21 is a plan view of another example of the printed wiring film of the present invention. A chip 213 has a row of terminal pads 217 formed along either side edge on one surface thereof. The film 211 is provided with slits 212 each corresponding to one row of pads 217 of the chip. The drawing represents the state wherein the chip 213 is disposed in the rear side of the film 211 and pads 217 of the chip appear through the slits 212. Patterns 218 of the film 211 are connected to the pads 217 from outside of the slits, as the case of the embodiment of FIG. 9. In the embodiment of FIG. 9, the entire portion of chip mounting area is opened, but in this embodiment of FIG. 21, the insulation film is left between the two slits 212. On this left portion 214 between the slits 212, patterns 215 are formed to interconnected the pads 217 of both sides of the chip. With such an arrangement, interconnection between the pads is efficiently conducted from the standpoint of space required for wiring or patterning for interconnection.

Figure 22:
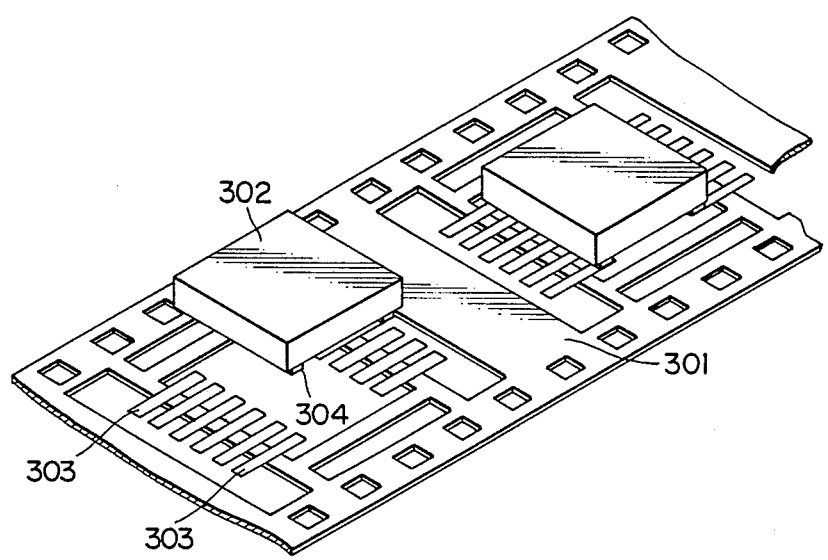

FIG. 22 is a perspective view of another example of chip mounting structure of the present invention. In this example, each chip 302 is supported on the film 301 through a plurality of connection conductors 303 in a floating state from the film. The conductors 303 are connected to the terminal pads 304 formed on the bottom surface of the chip 302.

I claim:

1. A magnetic bubble memory device comprising:
   a chip assembly including a plurality of bubble memory chips superposed one above the other on a main printed wiring film, the lowermost chip being electrically connected to wiring patterns formed on the main printed wiring film and each of the upper chip or chips being mounted on an auxiliary printed wiring film and electrically interconnected to the wiring patterns of the main printed wiring film through slots provided in the auxiliary printed wiring film,
   wherein the chip assembly is assembled with coils for generating a revolutional magnetic field disposed in a magnetic shield case in such a manner that the bubble memory chips and slots of the auxiliary printed wiring film are disposed inside of the coils and both ends of the main printed wiring film are disposed outside of the coils for outer connection.

2. A magnetic bubble memory device according to claim 1, further comprising a non-magnetic spacer interposed between the superposed upper and lower bubble memory chips.

3. A magnetic bubble memory device according to claim 1, wherein the chip assembly penetrates a coil assembly comprising X, Y, Z coils and at least one bias magnetic plate to form one bubble memory unit; and the bubble memory unit is directly mounted on a printed circuit board.

4. A magnetic bubble memory device according to claim 1, wherein each of the main and auxiliary printed wiring films has one bubble memory chip mounted thereon.

5. A magnetic bubble memory device according to claim 1, wherein each of the main and auxiliary printed wiring film has at least two bubble memory chips mounted thereon.

6. A magnetic bubble memory device according to claim 1, wherein each of the main printed wiring film and the auxiliary printed wiring film is made of flexible insulation film having wiring patterns formed thereon.

7. A magnetic bubble memory device according to claim 6, wherein the chip has a row of terminal pads along each side edge of the under surface thereof; the insulation film has an opening corresponding to the shape of the chip, the chip being held at the position of the opening; and lead patterns are connected to the terminal pads of the chip from outside of the opening.

8. A magnetic bubble memory device according to claim 6, wherein the chip has a row of terminal pads along each side edge of the under surface thereof; the insulation film has two slits each corresponding to the row of pads; and patterns for interconnecting the pads of the chip are formed on the insulation film between the two slits.

9. A magnetic bubble memory device according to claim 6, wherein the insulation film has an opening having a shape corresponding to the chip shape, the chip being held in a floating state on the film at the positions of the opening through connection conductors.

10. A magnetic bubble memory device according to claim 1, wherein the coils for generating the revolutional magnetic field comprise:
    a pair of plane coils each having a multiwound insulation coated wire and being folded to have a U-shaped sectional shape; and
    a solenoid coil having a multiwound insulation coated wire and having a center through hole.

11. A magnetic bubble memory device according to claim 6, wherein the chip assembly penetrates a coil assembly having X, Y, Z coils and at least one bias magnetic plate to form one bubble memory unit; a terminal plate having a number of pins is attached to each of end portions of the main printed wiring film; and the end portions of the main printed wiring film are folded under the lower side of the coil assembly.

12. A magnetic bubble memory device according to claim 10, wherein the chip assembly penetrates a coil assembly having X, Y, Z coils and at least one bias magnetic plate to form one bubble memory unit; and the bubble memory unit is installed within a recess of a terminal frame member having a number of pins projecting from a lower surface thereof; the patterns of the main printed wiring film being connected to patterns formed on the terminal frame member at each side of the bubble memory unit.

13. A magnetic bubble memory device according to claim 1, wherein the device comprises a drive coil assembly comprising an insulation molded body in which at least X and Y coils for generating plane revolutional magnetic field are insert-molded, the molded body having a through hole for insertion of bubble memory chips therein, and being provided with a recess on an outer surface thereof for receiving at least a bias magnetic plate.

14. A magnetic bubble memory device according to claim 13, wherein the coils for generating the revolutional magnetic field comprise: a pair of plane coils each comprising a multiwound insulation coated wire and being folded to have a U-shaped sectional shape; and a solenoid coil comprising a multiwound insulation coated wire and having a center through hole.

15. A magnetic bubble memory device according to claim 13, wherein the bubble memory chips are disposed within the through hole of the coil assembly in such a manner that the chip surface is inclined with respect to the bias magnetic plate surface.

16. A magnetic bubble memory device according to claim 13, wherein the insulation molded body further includes a Z coil which generates magnetic field perpendicular to the plane of revolutional magnetic field.

17. A magnetic bubble memory devices according to claim 16, wherein the outer surface of the molded body is covered by a shield case having openings at both ends thereof, and the wire ends of X, Y, Z coils are led out from the molded body through the openings of the shield case.

* * * * *